United States Patent
Yan et al.

(10) Patent No.: US 6,720,118 B2
(45) Date of Patent: Apr. 13, 2004

(54) ENHANCED INSPECTION OF EXTREME ULTRAVIOLET MASK

(75) Inventors: Pei-Yang Yan, Saratoga, CA (US); Ted Liang, Sunnyvale, CA (US); Guojing Zhang, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/423,733

(22) Filed: Apr. 25, 2003

(65) Prior Publication Data

US 2003/0203289 A1 Oct. 30, 2003

Related U.S. Application Data

(62) Division of application No. 09/823,637, filed on Mar. 30, 2001, now Pat. No. 6,583,068.

(51) Int. Cl.[7] .................................................. G03F 9/00
(52) U.S. Cl. .......................................................... 430/5
(58) Field of Search ..................... 430/5, 322; 378/34, 378/35; 382/144

(56) References Cited

U.S. PATENT DOCUMENTS

| 5,911,858 | A | 6/1999 | Ruffner |
| 5,928,817 | A | 7/1999 | Yan et al. |
| 6,015,640 | A | 1/2000 | Cardinale |
| 6,040,118 | A | 3/2000 | Capodieci |
| 6,048,652 | A | 4/2000 | Nguyen et al. |
| 6,140,020 | A | 10/2000 | Cummings |
| 6,410,193 | B1 * | 6/2002 | Stivers et al. .................. 430/5 |
| 6,479,195 | B1 | 11/2002 | Kirchauer et al. |

* cited by examiner

*Primary Examiner*—S. Rosasco
(74) *Attorney, Agent, or Firm*—George Chen

(57) ABSTRACT

The present invention discloses a method of increasing the contrast of an EUV mask at inspection by forming a multilayer mirror over a substrate; forming an absorber layer over the multilayer mirror; forming a top layer over the absorber layer; patterning the mask into a first region and a second region; and removing the top layer and the absorber layer in the first region.

18 Claims, 2 Drawing Sheets

ENHANCED INSPECTION OF EXTREME ULTRAVIOLET MASK

This is a Divisional application of Ser. No. 09/823,637 filed Mar. 30, 2001, which is now U.S. Pat. No. 6,583,068.

BACKGROUND OF THE INVENTION

1. Field of the Invention

The present invention relates to the field of semiconductor integrated circuit manufacturing, and more specifically, to a mask and a method of fabricating a mask used in extreme ultraviolet (EUV) lithography.

2. Discussion of Related Art

Ongoing improvements in lithography have allowed the shrinkage of semiconductor integrated circuits (IC) to produce devices with higher density and better performance. Deep ultraviolet (DUV) light with a wavelength of 248, 193, 157, or 126 nanometers (nm) may be used for optical lithography. However, a paradigm shift to Next Generation Lithography (NGL) should occur around the 70-nm node.

EUV lithography, a leading candidate for NGL, is based on exposure with EUV light having a wavelength of 10–15 nanometers. EUV light falls within a portion of the electromagnetic spectrum generally known as soft x-ray (2–50 nm). DUV lithography uses transmissive masks made from fused quartz, but nearly all materials are highly absorbing at the EUV wavelength so EUV lithography uses a reflective mask.

An EUV step-and-scan tool typically uses a 4x-reduction projection system. A wafer is exposed by stepping fields across the wafer and scanning an arc-shaped region of the EUV mask for each field. An EUV step-and-scan tool may have a 0.10 Numerical Aperture (NA) with 4 imaging mirrors. A critical dimension (CD) of 50–70 nm may be achieved with a depth of focus (DOF) of about 1 micrometer.

Alternatively, an EUV step-and-scan tool may have a 0.25 NA with 6 imaging mirrors to print a smaller CD of 20–30 nm, at the expense of a smaller DOF. Other tool designs with a 5x- or a 6x-reduction projection system, may also be used for EUV lithography.

Optical inspection of a mask is based on a comparison of the light signals in the patterned regions relative to the non-patterned regions. A high contrast is necessary in order to achieve sufficient sensitivity for defect detection. The transmissive masks used in DUV lithography can be inspected without difficulty since the contrast between the opaque regions and the clear regions is high at UV/DUV wavelengths. However, it is difficult to inspect the reflective masks used in EUV lithography since the contrast between the absorber region and the mirror region is low at UV/DUV wavelengths.

Thus, what is needed is an EUV mask with high contrast at the inspection wavelength and a process for fabricating such an EUV mask.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

Virtually all condensed materials absorb at the EUV wavelength so a mask for EUV lithography is reflective. A pattern on an EUV mask is defined by selectively removing portions of an absorber layer to uncover an underlying mirror. The inspection for defects on the ELV mask is usually done at UV/DUV wavelengths, but the contrast is often inadequate. The present invention is an EUV mask with high inspection contrast at the UV/DUV inspection wavelength and a process for fabricating such a high inspection contrast EUV mask.

Figure 1A:
FIGS. 1(a)–(e) are illustrations of a cross-sectional view of a high contrast EUV mask blank formed according to the present invention.

Various embodiments of a process for fabricating a high inspection contrast EUV mask according to the present invention will be described next. First, as shown in FIG. 1(a), a substrate 1100 with a low defect level and a smooth surface is used as the starting material for a high inspection contrast EUV mask of the present invention. It is desirable to form the substrate 1100 out of a glass or glass-ceramic material that has a low coefficient of thermal expansion (CTE). However, in some cases, the substrate 1100 may be formed from Silicon. Although Silicon has a large CTE that may result in undesirable displacement of printed images, Silicon also has a high thermal conductivity and thus may be a viable substrate as long as heat can be removed efficiently from the mask during exposure.

Figure 1B:
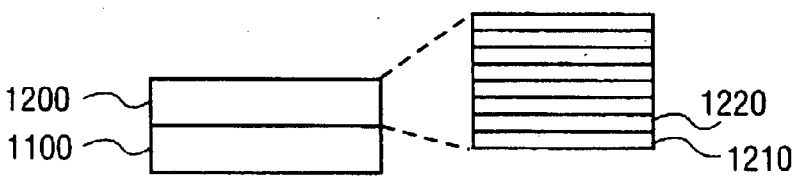

Second, as shown in FIG. 1(b), a multilayer (ML) mirror 1200 is then formed on the substrate 1100. The ML mirror 1200 has about 20–80 pairs of alternating layers of a high index of refraction material 1210 and a low index of refraction material 1220.

In one embodiment, the ML mirror 1200 has 40 pairs of alternating layers of a high index of refraction material 1210 and a low index of refraction material 1220. The high index of refraction material 1210 may be about 2.8 nm thick Molybdenum (Mo) while the low index of refraction material 1220 may be about 4.1 nm thick Silicon (Si). As needed, a capping layer 1230, such as about 11.0 nm thick Silicon (Si), may be formed at the top of the ML mirror 1200 to prevent oxidation of Molybdenum in the environment. The ML mirror 1200 can achieve about 60–75% reflectivity at the central illumination wavelength of about 13.4 nm.

The ML mirror 1200 is formed over the substrate 1100 by using ion beam deposition (IBD) or DC magnetron sputtering. The thickness uniformity should be better than 0.8% across the substrate 1100. On the one hand, IBD results in less perturbation and fewer defects in the upper surface of the ML mirror 1200 because the deposition conditions can usually be optimized to smooth over any defect on the substrate 1100. On the other hand, DC magnetron sputtering is more conformal, thus producing better thickness uniformity, but any defect on the substrate 1100 will tend to propagate up through the alternating layers to the upper surface of the ML mirror 1200.

Figure 1C:
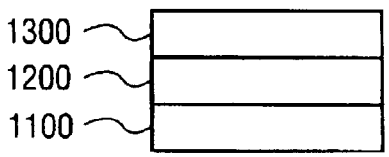

Third, as shown in FIG. 1(c), a buffer layer 1300 is formed over the upper surface of the ML mirror 1200. The buffer layer 1300 may have a thickness of about 20–105 nm. The buffer layer 1300 may be formed from Silicon Dioxide (SiO$_2$), such as low temperature oxide (LTO). A low process temperature, typically less than about 150 C., is desirable to prevent interdiffusion of the alternating layers in the underlying ML mirror 1200. Other materials, such as Silicon Oxynitride (SiOxNy) or Carbon (C) may also be used for the buffer layer 1300. The buffer layer 1300 may be deposited by RF magnetron sputtering.

Figure 1D:
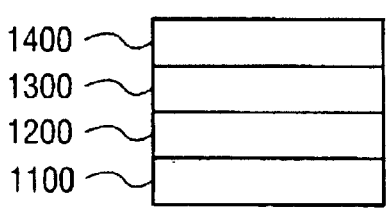

Fourth, as shown in FIG. 1(d), an absorber layer 1400 is formed over the buffer layer 1300. The absorber layer 1400 may be formed from about 45–215 nm of a material that will attenuate EUV light, remain stable during exposure to EUV light, and be compatible with the mask fabrication process. The absorber layer 1400 may be deposited with DC magnetron sputtering.

Various metals, alloys, and ceramics may be used to form the absorber layer 1400. Ceramics are compounds formed from metals and nonmetals. Examples of metals include Aluminum (Al), Aluminum-Copper (AlCu), Chromium (Cr), Nickel (Ni), Tantalum (Ta), Titanium (Ti), and Tungsten (W). In some cases, the absorber layer 1400 may be partially or entirely formed out of borides, carbides, nitrides, oxides, phosphides, silcides, or sulfides of certain metals. Examples include Nickel Silicide (NiSi), Tantalum Boride (TaB), Tantalum Germanium (TaGe), Tantalum Nitride (TaN), Tantalum Silicide (TaSi), Tantalum Silicon Nitride (TaSiN), and Titanium Nitride (TiN).

Figure 1E:
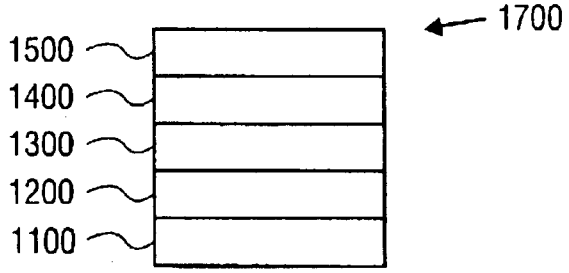

Fifth, as shown in FIG. 1(e), a top layer 1500 is formed over the absorber layer 1400. The top layer 1500 is usually thinner than the absorber layer 1400. For example, the top layer 1500 may be about 20 nm thick.

In one embodiment, the top layer 1500 has higher absorbance than the absorber layer 1400. In another embodiment, the top layer 1500 has lower reflectivity than the absorber layer 1400. In still another embodiment, the top layer 1500 has both higher absorbance and lower reflectivity than the absorber layer 1400.

Instead of forming the top layer 1500 as a discrete layer over the absorber layer 1400, another embodiment of the present invention contemplates forming the top layer 1500 from an original surface of the absorber layer 1400. In the case where the absorber layer 1400 is formed from Tantalum Nitride (TaN), the top layer 1500 may be formed by incorporating Fluorine (F) at the upper surface of the Tantalum Nitride.

The top layer 1500 may be formed by treating the absorber layer 1400 with a Perfluorocompound (PFC), such as CxHyFz gas, with a certain plasma power. The chamber may be similar to a vacuum chamber in a dry etch tool. In one embodiment, the gas is Octafluorocyclopentene (C$_5$F$_8$). In certain cases, the gas may have Bromine (Br) or Chlorine (Cl) partially or entirely substituted for the Fluorine. As desired, one or more other gases, such as Oxygen (O$_2$), Hydrogen (H$_2$), Nitrogen (N$_2$), Helium (He), or Argon (Ar), may be included in the chamber for part or all of the surface treatment of the absorber layer 1400.

The flowrate of each of the one or more gases present may be in the range of 1–125 standard cubic feet per minute (sccm). The treatment time may be in the range of 10–60 seconds (sec) depending on the gas flowrate and the plasma power selected.

A Unity II oxide etcher from Tokyo Electron (TEL) may be used to form the top layer 1500 by treating the absorber layer 1400. Some typical tool and process conditions are described next. The gap may be 27 mm. The pressure in the chamber may be about 40 milliTorr. The lower RF power may be about 1000 Watts. Flowrate may be about 6.0 sccm of C$_5$F$_8$, 3.0 sccm O$_2$, and 100.0 sccm Argon. The treatment time may be about 30 seconds.

As shown in FIG. 1(e), the combination of top layer 1500, absorber layer 1400, buffer layer 1300, ML mirror 1200, and substrate 1100 results in a high inspection contrast EUV mask blank 1700 that has high inspection contrast for inspection with UV/DUV light.

Figure 2A:
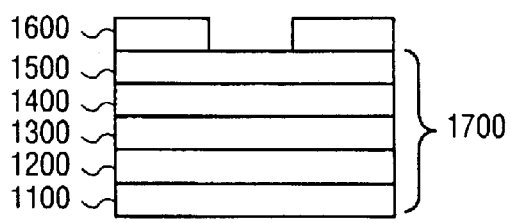
FIGS. 2(a)–(d) are illustrations of a cross-sectional view of a high contrast EUV mask formed according to the present invention.
Figure 2B:
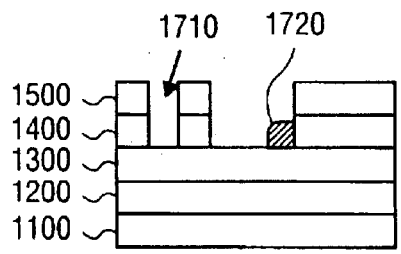
Figure 2C:
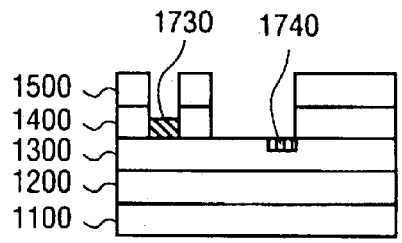
Figure 2D:
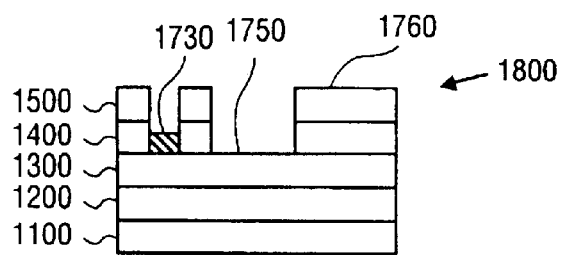

The high inspection contrast EUV mask blank 1700 shown in FIG. 1(e) can be further processed to produce a high inspection contrast EUV mask 1800 shown in FIG. 2(d) that has high inspection contrast for inspection with UV/DUV light.

First, as shown in FIG. 2(a), a high inspection contrast EUV mask blank 1700 is covered with a radiation-sensitive layer, such as photoresist 1600, that is coated, exposed, and developed with a desired pattern. The photoresist 1600 has a thickness of about 160–640 nm. As desired, a chemically-amplified resist (CAR) may be used. Exposure is performed with radiation that is appropriate for the photoresist 1600, such as deep ultraviolet (DUV) light or electron beam (e-beam).

After post-develop measurement of the critical dimension (CD) of the features in the pattern in the photoresist 1600, the pattern is transferred into the top layer 1500 and the absorber layer 1400. Reactive ion etch may be used. For example, an absorber layer 1400 may be dry etched with a gas which contains Chlorine, such as Cl$_2$ or BCl$_3$, or with a gas which contains Fluorine, such as NF$_3$. Argon (Ar) may be used as a carrier gas. In some cases, Oxygen (O$_2$) may be included. The etch rate and the etch selectivity depend on power, pressure, and substrate temperature.

The buffer layer 1300 serves as an etch stop layer to help produce a good etch profile in the overlying absorber layer 1400. The buffer layer 1300 also protects the underlying ML mirror 1200 from damage during the etch of the overlying absorber layer 1400.

Removal of the photoresist 1600 is followed by post-etch measurement of the CD of the features in the pattern in the top layer 1500 and the absorber layer 1400. Then defect inspection is done, typically with UV/DUV light at a wavelength of about 150–500 nm. The defect inspection is based on a comparison of the light signals in the patterned regions relative to the non-patterned regions. The present invention improves contrast by making the top layer 1500 appear significantly darker than the ML mirror 1200 in the UV/DUV light. Defect inspection may be done on a microscope such as a Zeiss Axiotron DUV microscope. The inspection may be performed at a wavelength of 248 nm or 193 nm with a Numerical Aperture (NA) of 0.90–0.95, an eyepiece magnification of 10×, and an objective magnification of 100–150×.

During production, masks may be inspected using automated tools. A variety of light sources, including lasers, may be used to provide UV/DUV wavelengths. Typical wavelengths include, but are not limited to, 488 nm, 365 nm, 266 nm, 257 nm, 248 nm, 198 nm, and 193 nm. The shorter wavelengths provide better resolution and are necessary as the features on the mask become smaller. The inspection may be based on die-to-die or die-to-data. The mask inspection tools may combine optical techniques with scanning of the mask to acquire images. If desired, the inspection may evaluate phase as well as amplitude.

As shown in FIG. 2(b), defects may occur in the top layer 1500 and the absorber layer 1400 as a result of the pattern transfer from the photoresist 1600. A first type of defect is a clear defect 1710 while a second type of defect is an opaque defect 1720. In a clear defect 1710, the absorber layer 1400 should be present, but it is entirely or partially missing. In an opaque defect 1720, the absorber layer 1400 should be removed, but it is entirely or partially present.

Repair of defects in the top layer 1500 and the absorber layer 1400 is performed with a focused ion beam (FIB) tool as needed. A clear defect 1710 is filled in with an opaque repair material 1730. An opaque defect 1720 is removed, leaving a Gallium stain 1740 in the underlying buffer layer 1300. Thus, the buffer layer 1300 also protects the underlying ML mirror 1200 from damage during repair of the top layer 1500 and the absorber layer 1400.

The buffer layer 1300 increases light absorption over the ML mirror 1200 when the high inspection contrast EUV mask 1800 is used during exposure of photoresist on a wafer. The resulting reduction in contrast can slightly degrade CD control of the features printed in the photoresist on a wafer so the buffer layer 1300 is removed wherever it is not covered by the top layer 1500 and the absorber layer 1400.

The buffer layer 1300 may be removed by dry etch or wet etch or a combination of dry etch and wet etch. The dry etch or wet etch used to remove the buffer layer 1300 must not damage the top layer 1500, the absorber layer 1400, or the ML mirror 1200. The buffer layer 1300 may be dry etched with a gas which contains Fluorine, such as $CF_4$ or $C_4F_8$. Oxygen ($O_2$) and a carrier gas, such as Argon (Ar), may be included. The buffer layer 1300 may also be wet etched, especially if it is very thin since any undercut of the absorber layer 1400 would then be very small. For example, a buffer layer 1300 formed from Silicon Dioxide ($SiO_2$) may be etched with an aqueous solution of about 3–5% hydrofluoric (HF) acid.

The result of the process described above is a high inspection contrast EUV mask 1800 having a reflective region 1750 and a dark region 1760, as shown in FIG. 2(d). For example, the presence of the top layer 1500 over the absorber layer 1400 can reduce reflectivity of a high inspection contrast EUV mask 1800 at UV/DUV wavelengths from greater than about 35% to less than about 5%. The corresponding contrast of the high inspection contrast EUV mask 1800 at UV/DUV wavelengths can be increased from less than about 35% to greater than about 80%.

Figure 3:
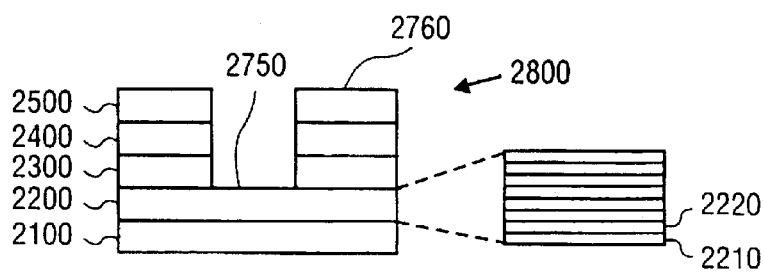
FIG. 3 is an illustration of a cross-sectional view of a high contrast EUV mask of the present invention.

Another embodiment of the present invention is a high inspection contrast EUV mask 2700 as shown in FIG. 3. A high inspection contrast EUV mask 2700 includes a top layer 2500, an absorber layer 2400, a buffer layer 2300, an ML mirror 2200, and a substrate 2100. The high inspection contrast EUV mask 2700 has a first region 2750 and a second region 2760. The first region 2750 is reflective because the ML mirror 2200 is uncovered. The second region 2760 is darker due to the top layer 2500 and the absorber layer 2400.

First, the high inspection contrast EUV mask 2700 of the present invention includes a substrate 2100 with a low defect level and a smooth surface. It is desirable that the substrate 2100 have a low coefficient of thermal expansion (CTE). The substrate 2100 may be a low CTE glass or a low CTE glass-ceramic. However, in certain cases, the substrate 2100 may be Silicon. Although Silicon has a large CTE that may result in undesirable displacement of printed images, Silicon also has a high thermal conductivity and thus is a viable substrate as long as heat can be removed efficiently from the mask during exposure.

Second, a multilayer (ML) mirror 2200 is disposed over the substrate 2100. The ML mirror 2200 has about 20–80 pairs of alternating layers of a high index of refraction material 2210 and a low index of refraction material 2220.

In one embodiment, the ML mirror 2200 has 40 pairs of the high index of refraction material 2210 and the low index of refraction material 2220. The high index of refraction material 2210 may be about 2.8 nm thick Molybdenum (Mo) while the low index of refraction material 2220 may be about 4.1 nm thick Silicon (Si). The ML mirror 2200 can achieve about 60–75% reflectivity at the central illumination wavelength of about 13.4 nm.

Third, a buffer layer 2300 is disposed over the ML mirror 2200. The buffer layer 2300 is about 20–105 nm thick. The buffer layer 2300 provides protection from damage for the underlying ML mirror 2200 during etch of the absorber layer 2400. The buffer layer 2300 also provides protection from damage for the underlying ML mirror 2200 during repair of the top layer 2500 and the absorber layer 2400.

The buffer layer 2300 may be Silicon Dioxide ($SiO_2$), such as low temperature oxide (LTO). Other materials, such as Silicon Oxynitride (SiOxNy) or Carbon (C) may also be used for the buffer layer 2300.

Fourth, an absorber layer 2400 is disposed over the buffer layer 2300. The absorber layer 2400 may be about 45–215 nm of a material that will attenuate EUV light, remain stable during exposure to EUV light, and be compatible with the mask fabrication process.

The absorber layer 2400 may include one or more metals, alloys, and ceramics. Ceramics are compounds formed from metals and nonmetals. Examples of metals include Aluminum (Al), Aluminum-Copper (AlCu), Chromium (Cr), Nickel (Ni), Niobium (Nb), Tantalum (Ta), Titanium (Ti), and Tungsten (W). In some cases, the absorber layer 2400 may partially or entirely include borides, carbides, hydrides, nitrides, oxides, or suicides of various metals. Examples include Nickel Silicide (NiSi), Tantalum Boride (TaB), Tantalum Nitride (TaN), Tantalum Silicide (TaSi), Tantalum Silicon Nitride (TaSiN), and Titanium Nitride (TiN).

Fifth, a top layer 2500 is disposed over the absorber layer 2400. The top layer 2500 is usually thinner than the absorber layer 2400. For example, the top layer 2500 may be about 20 nm thick.

In one embodiment, the top layer 2500 has higher absorbance than the absorber layer 2400. In another embodiment, the top layer 2500 has lower reflectivity than the absorber layer 2400. In still another embodiment, the top layer 2500 has both higher absorbance and lower reflectivity than the absorber layer 2400. The top layer 2500 may include one or more metals, such as Tantalum, and one or more nonmetals, such as Fluorine (F), Oxygen (O), Argon (Ar), Carbon (C), Hydrogen (H), and Nitrogen (N).

For example, during the inspection of an EUV mask at UV/DUV wavelengths, the presence of a top layer 2500 over an absorber layer 2400 can reduce reflectivity from greater than about 35% to less than about 5%. For comparison, the ML mirror 2200 has a reflectivity of about 60–75%. As a result, the contrast during inspection can be increased from less than about 35% to greater than about 80%. The extent of benefit on inspection from using the top layer 2500 will vary depending on the type, the thickness, and the surface roughness of the one or more materials selected for the top layer 2500. The extent of benefit on inspection will also depend on the wavelength of the light used for inspection.

The top layer 2500 may have a rough surface. The roughness may help reduce the interference during exposure between the EUV light incident on the mask and the EUV light reflected from the top layer 2500. The extent of benefit on critical dimension (CD) control from using the top layer 2500 will vary depending on the type, the thickness, and the surface roughness of the one or more materials selected for the top layer 2500. The extent of benefit on CD control will also depend on the wavelength of the light used for exposure and the step height between the ML mirror 2200 and the top layer 2500.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described an EUV mask with high contrast at the inspection wavelength and a process for fabricating such a high inspection contrast EUV mask.

We claim:

1. A mask comprising:

a substrate;

a multilayer mirror disposed over said substrate, said multilayer mirror having a first region and a second region;

an absorber layer disposed over said second region of said multilayer mirror, said absorber layer being absorbent at a first wavelength; and a top layer disposed over said absorber layer, said top layer being absorbent at a second wavelength.

2. The mask of claim 1 wherein said substrate has a low coefficient of thermal expansion.

3. The mask of claim 1 wherein said first wavelength comprises Extreme Ultraviolet (EUV) wavelength.

4. The mask of claim 1 wherein said second wavelength comprises Ultraviolet (UV) or Deep Ultraviolet (DUV) wavelength.

5. The mask of claim 1 wherein said multilayer mirror comprises alternating layers of a high index of refraction material and a low index of refraction material.

6. The mask of claim 1 wherein said multilayer mirror comprises Molybdenum and Silicon.

7. The mask of claim 1 wherein a buffer layer is further disposed over said multilayer mirror and below said absorber layer in said second region.

8. The mask of claim 1 wherein said absorber layer comprises a metal.

9. The mask of claim 1 wherein said absorber layer comprises an alloy.

10. The mask of claim 1 wherein said absorber layer comprises a ceramic.

11. The mask of claim 1 wherein said top layer comprises a metal.

12. The mask of claim 1 wherein said top layer comprises an alloy.

13. The mask of claim 1 wherein said top layer comprises a ceramic.

14. The mask of claim 1 wherein said top layer comprises Fluorine.

15. The mask of claim 1 wherein said top layer comprises Oxygen.

16. The mask of claim 1 wherein said top layer comprises Argon.

17. The mask of claim 1 wherein said top layer comprises Carbon.

18. The mask of claim 1 wherein said top layer comprises Hydrogen.

* * * * *

UNITED STATES PATENT AND TRADEMARK OFFICE
CERTIFICATE OF CORRECTION

PATENT NO. : 6,720,118 B2
DATED : April 13, 2004
INVENTOR(S) : Yan et al.

It is certified that error appears in the above-identified patent and that said Letters Patent is hereby corrected as shown below:

Column 2,
Line 15, delete "ELV" and insert -- EUV --.

Column 3,
Line 22, delete "silcides" and insert -- silicides --.

Column 6,
Line 33, delete "suicides" and insert -- silicides --.

Signed and Sealed this

Thirtieth Day of November, 2004

JON W. DUDAS
*Director of the United States Patent and Trademark Office*